(12) United States Patent
Ichikawa et al.

(10) Patent No.: US 10,641,652 B2
(45) Date of Patent: May 5, 2020

(54) PHOTOELECTRIC SENSOR

(71) Applicant: PANASONIC INDUSTRIAL DEVICES SUNX CO., LTD., Aichi (JP)

(72) Inventors: Hiroki Ichikawa, Aichi (JP); Takayuki Ochiai, Aichi (JP)

(73) Assignee: PANASONIC INDUSTRIAL DEVICES SUNX CO., LTD., Aichi (JP)

( * ) Notice: Subject to any disclaimer, the term of this patent is extended or adjusted under 35 U.S.C. 154(b) by 219 days.

(21) Appl. No.: 15/560,769

(22) PCT Filed: Jan. 18, 2016

(86) PCT No.: PCT/JP2016/051241
§ 371 (c)(1),
(2) Date: Sep. 22, 2017

(87) PCT Pub. No.: WO2016/157939
PCT Pub. Date: Oct. 6, 2016

(65) Prior Publication Data
US 2018/0080817 A1   Mar. 22, 2018

(30) Foreign Application Priority Data
Mar. 31, 2015   (JP) .................................. 2015-072572

(51) Int. Cl.
*G01J 1/42* (2006.01)
*G01V 8/12* (2006.01)
(Continued)

(52) U.S. Cl.
CPC .............. *G01J 1/42* (2013.01); *G01J 1/0411* (2013.01); *G01V 8/12* (2013.01); *H01H 35/00* (2013.01); *H01L 31/02* (2013.01)

(58) Field of Classification Search
CPC . G01J 1/42; G01J 1/0411; G01V 8/12; H01H 35/00; H01L 31/02
See application file for complete search history.

(56) References Cited

U.S. PATENT DOCUMENTS

| 2004/0083817 A1 | 5/2004 | Nomura |
| 2005/0035421 A1 | 2/2005 | Kayanuma et al. |
| (Continued) | | |

FOREIGN PATENT DOCUMENTS

| CN | 1260552 C | 6/2006 |
| CN | 1914740 A | 2/2007 |
| (Continued) | | |

OTHER PUBLICATIONS

International Search Report issued in PCT/JP2016/051241; dated Mar. 8, 2016.
(Continued)

*Primary Examiner* — Kevin K Pyo
*Assistant Examiner* — Don J Williams
(74) *Attorney, Agent, or Firm* — Studebaker & Brackett PC (57) ABSTRACT

In a case made of resin and provided with a condensing lens through which light is transmitted, a circuit board on which a photoelectric element to be disposed at the focus position of the condensing lens is accommodated. The circuit board has a through hole through which the light having been transmitted through the condensing lens passes. Furthermore, the photoelectric element is mounted on the back face of the circuit board on the opposite side of the condensing lens and receives the light having passed through the through hole.

8 Claims, 7 Drawing Sheets

(51) Int. Cl.
　　*H01H 35/00*　　(2006.01)
　　*H01L 31/02*　　(2006.01)
　　*G01J 1/04*　　(2006.01)

(56) References Cited

U.S. PATENT DOCUMENTS

| | | | |
|---|---|---|---|
| 2006/0043514 A1 | 3/2006 | Shizuno | |
| 2007/0138493 A1 | 6/2007 | Morimoto et al. | |
| 2011/0096213 A1* | 4/2011 | Hasegawa | G02B 13/0035 348/294 |
| 2014/0268522 A1 | 9/2014 | Tanaka et al. | |
| 2015/0285910 A1* | 10/2015 | Ono | G01S 17/026 250/553 |

FOREIGN PATENT DOCUMENTS

| | | |
|---|---|---|
| EP | 2 325 600 A1 | 5/2011 |
| EP | 2 700 901 A1 | 2/2014 |
| JP | H01-095038 U1 | 6/1989 |
| JP | 2002-252357 A | 9/2002 |
| TW | 200526011 A | 8/2005 |
| WO | 2006/016504 A1 | 2/2006 |
| WO | 2007/042497 A2 | 4/2007 |

OTHER PUBLICATIONS

Written Opinion issued in PCT/JP2016/051241; dated Mar. 8, 2016.
An Office Action mailed by the State Intellectual Property Office of the People's Republic of China dated Aug. 2, 2018, which corresponds to Chinese Patent Application No. 201680020141.7 and is related to U.S. Appl. No. 15/560,769.
The extended European search report issued by the European Patent Office dated Oct. 18, 2018, which corresponds to European Patent Application No. 16771825.3-1003 and is related to U.S. Appl. No. 15/560,769.

* cited by examiner

Drawing-out Direction of Cable ↓

FIG.8

FIG.9

PHOTOELECTRIC SENSOR

TECHNICAL FIELD

The present invention relates to a photoelectric sensor.

BACKGROUND ART

As a photoelectric sensor equipped with a photoelectric element for receiving the light projected from a light projecting element, the photoelectric sensor described in Patent Document 1, for example, is available. A circuit board on which a photoelectric element is mounted is accommodated inside the case of this photoelectric sensor. Furthermore, the case holds a condensing lens for condensing light toward the photoelectric element. The photoelectric element is mounted on the face of the circuit board on the opposite side of the condensing lens, and a through hole is formed in the circuit board at the position between the condensing lens and the photoelectric element. In this photoelectric sensor, the light condensed by the condensing lens passes through the through hole of the circuit board and reaches the photoelectric element. The photoelectric sensor then detects an object to be detected on the basis of the change in the amount of the light received by the photoelectric element.

However, the side face of the photoelectric element on the light receiving side thereof is easily affected by radiation noise. Hence, it is preferable that an electromagnetic shield covering the side face of the photoelectric element on the light receiving side thereof is provided to prevent erroneous detection of an object to be detected and to prevent malfunction of the photoelectric sensor. In the photoelectric sensor described in Patent Document 1, a ground-level shielding pattern face is formed as an electromagnetic shield on the face of the circuit board on the side of the condensing lens, that is, around the through hole on the face of the circuit board on the opposite side on which the photoelectric element is mounted. Furthermore, in the photoelectric sensor described in Patent Document 1, the photoelectric element is mounted on the face of the circuit board on the opposite side of the condensing lens, and the shielding pattern face is formed on the face of the circuit board on the side of the condensing lens, whereby the photoelectric sensor is made compact in comparison with the case in which a metal shield case serving as an electromagnetic shield is fixed to the circuit board.

PRIOR ART DOCUMENT

Patent Document

Patent Document 1: JP-A-2002-252357

SUMMARY OF THE INVENTION

Problem that the Invention is to Solve

However, since photoelectric sensors are used in various places, it has been desired that such photoelectric sensors should be made more compact so that they can be installed in narrower places.

The present invention has been made to solve the above-mentioned problem and is intended to provide a photoelectric sensor capable of being made more compact.

Means for Solving the Problem

A photoelectric sensor for solving the above-mentioned problem is equipped with a case made of resin and provided with a condensing lens through which light is transmitted; a circuit board on which a photoelectric element to be disposed at the focus position of the condensing lens is mounted and which is accommodated in the case; and a plate member made of metal and insert-molded in the case so as to be parallel with the circuit board, wherein the circuit board has a through hole through which the light having been transmitted through the condensing lens passes; the photoelectric element is mounted on the face of the circuit board on the opposite side of the condensing lens and receives the light having passed through the through hole; and the plate member is disposed on the opposite side of the condensing lens with respect to the circuit board and has a cutout section passing through the plate member at the position overlapping with the photoelectric element in the thickness direction of the circuit board.

With this configuration, the plate member is provided with a cutout section passing through the plate member at the portion overlapping with the photoelectric element in the thickness direction of the circuit board. Hence, the plate member can be brought close to the circuit board in the thickness direction of the circuit board while the insulation between the plate member and the photoelectric element is secured. Consequently, the photoelectric sensor can be made more compact in the thickness direction of the circuit board.

In the above-mentioned photoelectric sensor, it would be preferable that the plate member may include folded sections folded to the inside of the case and embedded in the resin constituting the case, and that the folded sections includes contact faces directed to the base end sides of the folded sections and contacting with the resin constituting the case.

With this configuration, the folded sections to be embedded in the resin constituting the case are provided on the plate member, and the resin constituting the case makes contact with the contact faces provided on the folded sections, whereby the plate member is hardly separated from the case in the thickness direction of the plate member. Consequently, the integration strength between the case and the plate member insert-molded in the case can be increased.

In the above-mentioned photoelectric sensor, it would be preferable that the plate member may have a flat plate section having a flat plate shape and provided so as to be parallel with the circuit board, and that the folded sections may be formed by folding the peripheral section of the plate member so as to have an angle of 90° or more with respect to the flat plate section on the inner side of the case.

With this configuration, the space inside the case in which the circuit board is disposed is suppressed from being narrowed by the folded sections. Consequently, the integration strength between the case and the plate member can be increased while the enlargement of the case due to the folded sections provided on the plate member is suppressed.

In the above-mentioned photoelectric sensor, it would be preferable that the folded sections may be formed so as to have an angle of 90° with respect to the flat plate section on the inner side of the case and may have cutout holes passing through the folded sections, and that the contact faces may be provided on the inner peripheral faces of the cutout holes.

With this configuration, while the space inside the case in which the circuit board is disposed is suppressed from being narrowed by the folded sections, the plate member having the folded sections can be made most compact. Hence, the case can be made more compact in the direction parallel with the plate member; as a result, the photoelectric sensor can be made further more compact. In addition, since the contact faces are provided on the inner peripheral faces of the cutout holes formed in the folded sections, the folded sections are not required to be subjected to any complicated processing to provide the contact faces.

In the above-mentioned photoelectric sensor, it would be preferable that the cable drawn out from the case to the outside may be connected to the circuit board, that the plate member may have the cable neighborhood folded sections folded to the inner side of the case at the portion overlapping with cable in the thickness direction of the circuit board, and that the cable neighborhood folded sections may have the cable neighborhood contact faces directed to the base end sides of the cable neighborhood folded sections and making contact with the resin constituting the case.

With this configuration, the cable neighborhood folded sections having the cable neighborhood contact faces are formed on the plate member at the portion overlapping with the cable in the thickness direction of the circuit board. Hence, the integration strength between the case and the plate member can be increased at the portion to which a large force may be applied via the cable, for example, when the cable is pulled.

In the above-mentioned photoelectric sensor, it would be preferable that the case may have a case body made of resin in which the circuit board is accommodated and the plate member is insert-molded; a cover made of resin which is disposed so as to cover the case body and in which the condensing lens is provided; and a joint section made of resin which is formed by two-color molding between the case body and the cover so as to integrate the case body and the cover, that a cable drawn out from the joint section to the outside of the case may be connected to the circuit board; that the joint section may have the first engaging section for receiving the force applied from the case body in the drawing-out direction of the cable; and that the case body may have a second engaging section engaging with the first engaging section in the drawing-out direction of the cable.

With this configuration, the first engaging section of the joint section engages with the second engaging section of the case body in the drawing-out direction of the cable. Since the case body accommodates the circuit board to which the cable is connected, the case body is pulled in the drawing-out direction of the cable when the cable is pulled. Hence, the first engaging section engaging with the second engaging section of the case body in the drawing-out direction of the cable is provided in the joint section, whereby the case can be suppressed from being displaced in the drawing-out direction of the cable with respect to the cover when the cable is pulled.

In the above-mentioned photoelectric sensor, it would be preferable that the cover may have cover-side engaging sections engaging with the joint section so as to be relatively unmovable in the thickness direction of the circuit board on the side of the condensing lens rather than the circuit board.

With this configuration, the cover can be suppressed from coming off from the joint section in the thickness direction of the circuit board.

In the above-mentioned photoelectric sensor, it would be preferable that the case body may have a bottom section on which the circuit board is disposed and side wall sections standing upright on the peripheral section of the bottom section, that indication lamps emitting light may be disposed on the circuit board, and that the cover may have light transmissivity so as to allow the light of the indication lamps to be transmitted and may have an extension section extending to the side of the bottom section further than the face of the circuit board on the opposite side of the condensing lens at the outer periphery of the circuit board and extension section-side engaging sections engaging with the joint section on the side of the bottom section rather than the circuit board so as to be relatively unmovable in the thickness direction of the circuit board or in the direction parallel with the circuit board.

With this configuration, the extension section can be suppressed from coming off from the joint section, and the cover can eventually be suppressed from coming off from the joint section.

Advantage of the Invention

The photoelectric sensor according to the present invention can be made more compact.

MODE FOR CARRYING OUT THE INVENTION

An embodiment of a photoelectric sensor will be described below.

The photoelectric sensor according to this embodiment is a transmission-type photoelectric sensor in which a light projector for projecting light, such as laser light, and a light receiver for receiving the light from the light projector are disposed so as to be opposed to each other.

Figure 1:
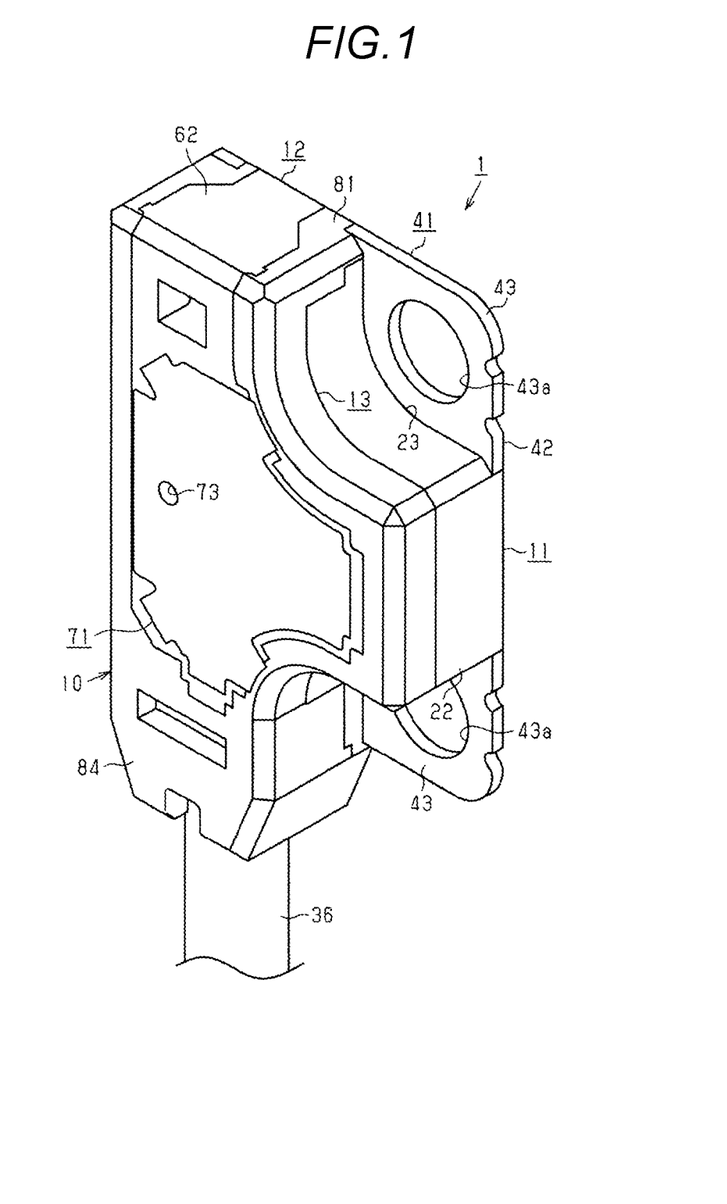
FIG. 1 is a perspective view showing the light receiver of a photoelectric sensor according to an embodiment.
Figure 2:
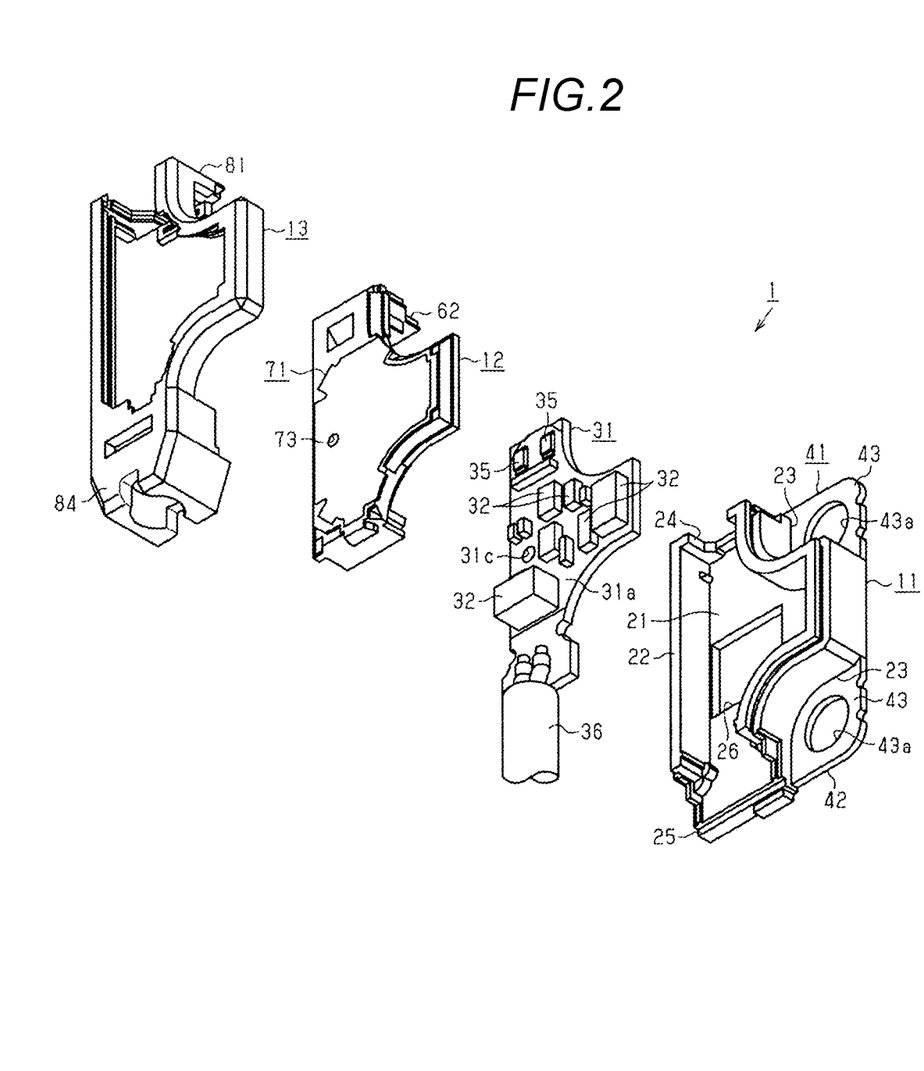
FIG. 2 is an exploded perspective view showing the light receiver of the photoelectric sensor according to the embodiment.

As shown in FIGS. 1 and 2, the case 10 of a light receiver 1 has a nearly toppled T-shape as viewed from the front. The case 10 is composed of a case body 11, a cover 12 disposed on the front of the case body 11, and a joint section 13 for integrating the case body 11 and the cover 12. The case body 11, the cover 12 and the joint section 13 are all made of resin.

The case body 11 has a bottom section 21 having a flat shape and side wall sections 22 standing upright on the peripheral section of the bottom section 21. The bottom section 21 has a shape obtained such that, of the four corner sections of a rectangle, the two corner sections adjacent to each other in the longitudinal direction of the rectangle are cut out in an arc shape from the rectangle, thereby having a nearly toppled T-shape as viewed from the thickness direction thereof. On the bottom section 21, the portions being cut out in the arc shape serve as exposed concave sections 23. Furthermore, the side wall sections 22 stand upright so as to be orthogonal to the bottom section 21. However, the side wall section 22 is not provided at one end section (the lower end section in FIG. 2) in the longitudinal direction of the case body 11. Moreover, in the side wall section 22 provided at the other end section (the upper end section in FIG. 2) in the longitudinal direction of the case body 11, an indication concave section 24 recessed toward the base end of the side wall section 22 is formed. The indication concave section 24 passes through the side wall section 22 in the thickness direction of the side wall section 22.

Figure 7A:
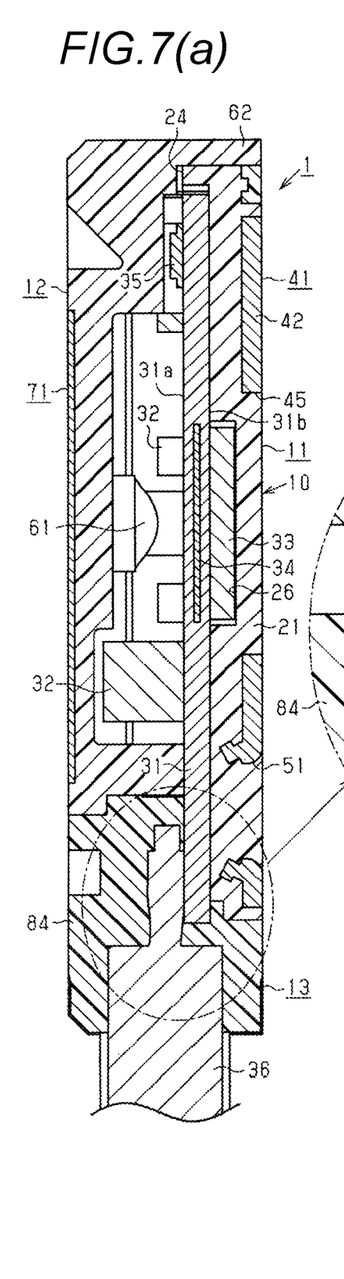
FIGS. 7(a) and 7(b) are sectional views showing the light receiver of the photoelectric sensor according to the embodiment.
Figure 7B:
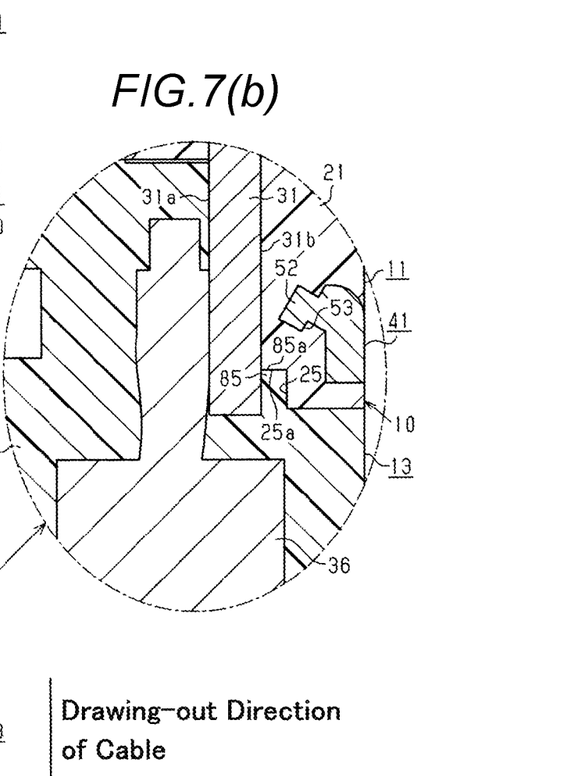

What's more, on the case body 11, an engaging step section 25 is formed at the end section of the bottom section 21 on the opposite side of the display concave section 24. The engaging step section 25 is a step section provided on the inner side of the case body 11 so that the thickness of the end section of the bottom section 21 on the opposite side of the display concave section 24 is reduced. Furthermore, the engaging step section 25 is formed from one end to the other end of the bottom section 21 in the lateral direction of the case body 11. Moreover, as shown in FIG. 7(b), the inner side face of the engaging step section 25 has a case body-side engaging face 25a having a flat shape orthogonal to the longitudinal direction of the bottom section 21.

Figure 3:
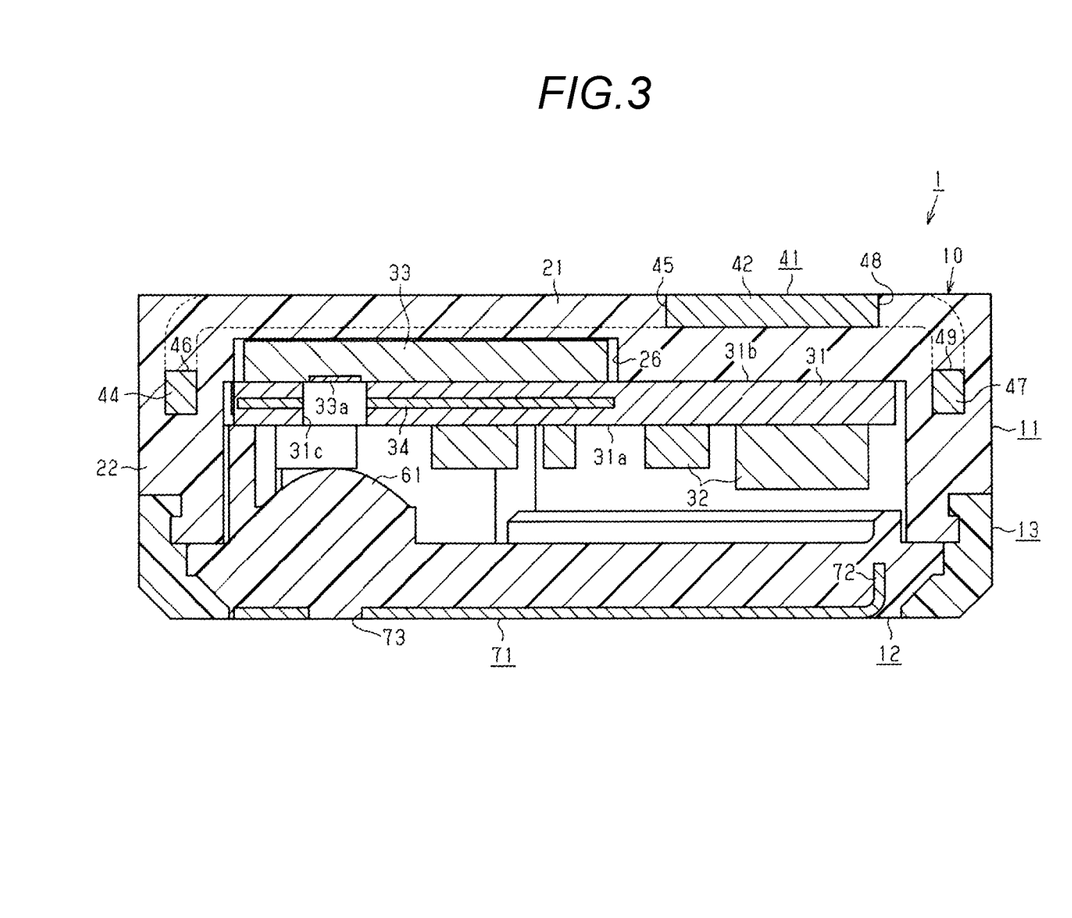
FIG. 3 is a sectional view showing the light receiver of the photoelectric sensor according to the embodiment.

As shown in FIGS. 2 and 3, a circuit board 31 is accommodated inside the case body 11. The circuit board 31 has a flat plate shape and is disposed so as to make contact with the bottom section 21 in parallel with the bottom section 21. Furthermore, the circuit board 31 is formed such that the shape thereof as viewed from the thickness direction thereof is nearly equal to the shape of the portion of the bottom section 21 inside the side wall sections 22 and has a nearly toppled T-shape. Of both the end faces of the circuit board 31 in the thickness direction thereof, the front face 31a thereof on the opposite side of the bottom section 21 is provided with various kinds of electronic components 32 mounted thereon.

As shown in FIG. 3, of both the end faces of the circuit board 31 in the thickness direction thereof, the back face 31b thereof on the side of the bottom section 21 is provided with a photoelectric element 33 mounted thereon. The photoelectric element 33 is, for example, a photo IC, and is flip-chip mounted on the back face 31b of the circuit board 31. The flip chip includes a WLCSP (wafer level chip size package). Furthermore, the photoelectric element 33 has a photoelectric conversion section 33a (for example, a photodiode) for receiving light and outputting an electric signal depending on the amount of the light. In the circuit board 31, a through hole 31c passing through the circuit board 31 in the thickness direction thereof is formed at the position corresponding to the photoelectric conversion section 33a, whereby the light having passed through the through hole 31c is received by the photoelectric conversion section 33a.

Furthermore, inside the circuit board 31, a shielding pattern 34 is provided around the through hole 31c. The circuit board 31 is, for example, formed of a multilayer board, and the shielding pattern 34 is formed inside the board. The shielding pattern 34 is provided so as to serve as an electromagnetic shield for the photoelectric element 33 and is formed in the circuit board 31 around the through hole 31c at least in a range in which the photoelectric element 33 and the circuit board 31 overlap with each other in the thickness direction. In addition, the shielding pattern 34 is connected to the ground. The shielding pattern 34 is, for example, made of copper. However, since the back face of the photoelectric element 33 (that is, the face on the opposite side of the circuit board 31) is connected to the ground, the back face is not required to be provided with an electromagnetic shield.

As shown in FIG. 2, two indication lamps 35 are mounted on the front face 31a of the circuit board 31 at a portion in the vicinity of the indication concave section 24. For example, an LED is used as each indication lamp 35. One indication lamp 35 is lit when the amount of the received light at the light receiver 1 reaches a constant amount or more (when the amount of the light incident onto the photoelectric element 33 becomes stable). The other indication lamp 35 serves, for example, as a detection indication lamp and is lit when an object to be detected is detected. The indication lamps 35 are driven by drive circuits formed on the circuit board 31.

Furthermore, on the front face 31a of the circuit board 31, a cable 36 is connected to the end section of the circuit board on the opposite side of the indication lamps 35. In other words, the cable 36 is connected to the circuit board 31 accommodated in the case body 11 in the vicinity of the engaging step section 25. Moreover, the cable 36 is drawn out to the outside of the case 10 along the longitudinal direction of the case body 11. Power source is supplied to the light receiver 1 via the cable 36.

As shown in FIGS. 2 and 3, a photoelectric element accommodating concave section 26 is recessed at the position corresponding to the photoelectric element 33 (at the position overlapping with the photoelectric element 33 in the thickness direction of the circuit board 31) at the nearly central section of the bottom section 21 of the case body 11. The photoelectric element accommodating concave section 26 is formed such that the face of the bottom section 21 on the inner side of the case body 11 is recessed in the thickness direction of the bottom section 21. Furthermore, the photoelectric element accommodating concave section 26 has a square shape, one size larger than that of the photoelectric element 33, as viewed from the thickness direction of the bottom section 21. Moreover, the depth of the photoelectric element accommodating concave section 26 is made slightly larger than the thickness of the photoelectric element 33. What's more, the photoelectric element 33 mounted on the circuit board 31 is accommodated in the photoelectric element accommodating concave section 26.

Figure 4:
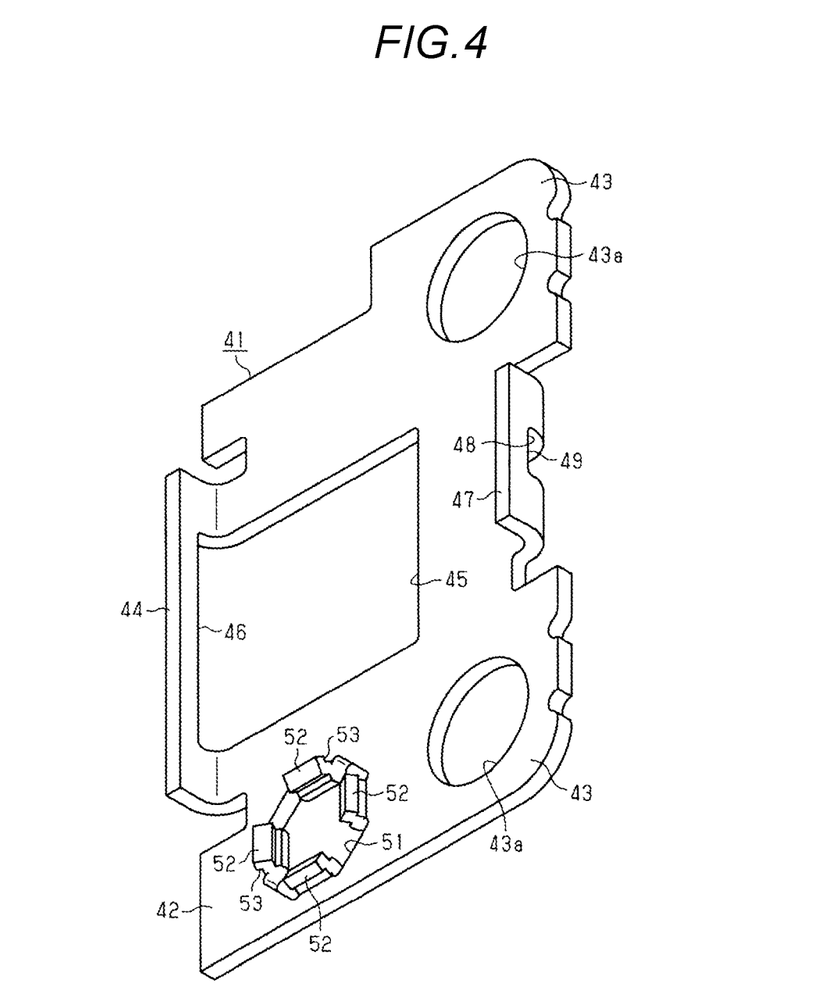
FIG. 4 is a perspective view showing a plate member according to the embodiment.

As shown in FIGS. 2 to 4, in the case body 11, a plate member 41 formed of a metal plate is insert-molded so as to be parallel with the circuit board 31. This plate member 41 is formed by pressing a metal plate into a nearly rectangular plate shape.

The plate member 41 has a flat plate section 42 having a flat plate shape. The flat plate section 42 has a nearly rectangular shape as viewed from the thickness direction thereof and is formed so as to be larger than the circuit board 31. Furthermore, the flat plate section 42 is embedded in the bottom section 21 in a state in which one end face thereof in the thickness direction thereof is exposed to the outside of the case body 11, and is made parallel with the circuit board 31. Moreover, the corner sections of both the ends of the flat plate section 42 in the longitudinal direction thereof protrude to the outside of the bottom section 21 from the exposed concave sections 23 on one end side (the right side in FIG. 2) in the lateral direction thereof. Still further, the portions of the flat plate section 42 exposed from the exposed concave sections 23 to the outside of the bottom section 21 serve as fixing sections 43 for fixing the light receiver 1 to an external fixing place. An insertion hole 43a passing through each fixing section 43 in the thickness direction thereof is formed in each fixing section 43. The light receiver 1 is fixed to the external fixing place by inserting a screw, not shown, into each insertion hole 43a and by tightening the screw.

Furthermore, as shown in FIGS. 3 and 4, the plate member 41 has a first folded section 44 that is formed by folding part of the peripheral section of the plate member 41 toward the inside of the case body 11. This first folded section 44 extends from the other end of the plate section 42 in the lateral direction thereof (the end on the opposite sides of the fixing sections 43). Moreover, the first folded section 44 is formed so as to be shorter than the flat plate section 42 in the longitudinal direction of the plate member 41. What's more, an angle of 90° is formed between the first folded section 44 and the flat plate section 42 on the inner side of the case 10. Still further, the tip end of the first folded section 44 is positioned on the side of the cover 12 rather than the back face 31b of the circuit board 31.

In addition, a first cutout hole 45 passing through the plate member 41 in the thickness direction thereof is formed at the nearly central section of the plate member 41. The first cutout hole 45 is formed in the plate member 41 at the portion overlapping with the photoelectric element 33 in the thickness direction of the circuit board 31. Furthermore, the first cutout hole 45 is formed into a square shape larger than the photoelectric element 33 as viewed from the thickness direction of the plate member 41. The photoelectric element accommodating concave section 26 and the photoelectric element 33 are positioned inside the first cutout hole 45 as viewed from the thickness direction of the circuit board 31 (the same direction as the thickness direction of the plate member 41). The photoelectric element accommodating concave section 26 is provided on the side of the circuit board 31 rather than the flat plate section 42, and the photoelectric element accommodating concave section 26 and the photoelectric element 33 are not inserted in the inside of the first cutout hole 45. Moreover, the first cutout hole 45 extends from the flat plate section 42 to the first folded section 44 and is also formed in the range from the base end of the first folded section 44 to a nearly half-height position of the first folded section 44. What's more, the first cutout hole 45 is positioned at a nearly central section of the first folded section 44 in the longitudinal direction of the plate member 41 and is also formed in the range of approximately three-fifths of the length of the first folded section 44. Still further, on the inner peripheral face of the first cutout hole 45, a first contact face 46 directed to the base end side of the first folded section 44 is formed at the tip end side portion of the first folded section 44. In this embodiment, the first contact face 46 has a flat shape being parallel with the flat plate section 42.

In addition, at the end section of the plate member 41 on the opposite side of the first folded section 44, the plate member 41 has a second folded section 47 that is formed by folding the peripheral section of the plate member 41 toward the inside of the case 10. The second folded section 47 is formed by folding the portion between the two fixing sections 43 at one end section (the right end section in FIG. 4) of the plate member 41 in the lateral direction thereof to the inside of the case 10. Hence, the second folded section 47 extends from one end of the flat plate section 42 in the lateral direction thereof. Furthermore, an angle of 90° is formed between the second folded section 47 and the flat plate section 42 on the inner side of the case 10. Moreover, the tip end of the second folded section 47 is positioned on the side of the cover 12 rather than the back face 31b of the circuit board 31. What's more, in the second folded section 47, a second cutout hole 48 passing through the second folded section 47 in the thickness direction thereof is formed in the second folded section 47. On the inner peripheral face of the second cutout hole 48, a second contact face 49 directed to the base end side of the second folded section 47 is formed at the tip end side portion of the second folded section 47. The second contact face 49 has a flat shape being parallel with the flat plate section 42.

The first folded section 44 and the second folded section 47 are embedded in the inside of the case body 11, and the tip end sections thereof are respectively embedded in the insides of the side wall sections 22. Furthermore, since the inside of the first cutout hole 45 is filled with resin constituting the case body 11, the resin constituting the case body 11 makes contact with the first contact face 46. Moreover, since the inside of the second cutout hole 48 is also filled with the resin constituting the case body 11, the resin constituting the case body 11 makes contact with the second contact face 49.

Figures 5A, 5B:
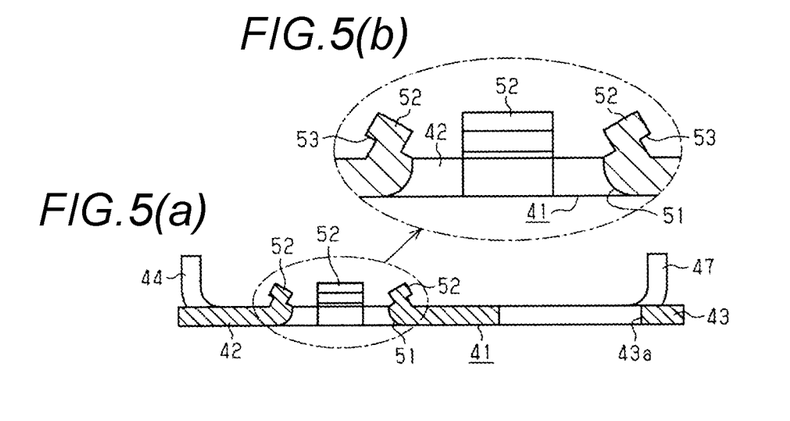
FIGS. 5(a) and 5(b) are sectional views showing the plate member according to the embodiment.

As shown in FIGS. 4 and 5 (a), an embedding hole 51 passing through the flat plate section 42 in the thickness direction thereof is formed at one end section (the lower end section in FIG. 4) of the flat plate section 42 in the longitudinal direction thereof. As shown in FIG. 7(a), the embedding hole 51 is provided at the position overlapping, in the thickness direction of the circuit board 31, with the portion of the circuit board 31 to which the cable 36 is connected. Moreover, as shown in FIG. 4, the embedding hole 51 has a nearly octagonal shape as viewed from the thickness direction of the flat plate section 42.

As shown in FIGS. 4, 5(a), 5(b) and 7(a), a plurality of cable neighborhood folded sections 52 extends from the inner peripheral face of the embedding hole 51 to the inner side of the case 10. In this embodiment, the cable neighborhood folded sections 52 extend from four sides of the eight sides of the embedding hole 51 having the octagonal shape, that is, from every other sides of the eight sides, whereby four cable neighborhood folded sections 52 are formed as viewed from the thickness direction of the flat plate section 42. Each cable neighborhood folded section 52 is bent to the inner side of the case body 11 at the base end section thereof, and the portion thereof on the tip end side thereof is folded to the outer peripheral side of the embedding hole 51. Hence, on the side face of each cable neighborhood folded section 52 on the outer peripheral side of the embedding hole 51, a cable neighborhood contact face 53 directed to the base end side of the cable neighborhood folded section 52 (to the side of the flat plate section 42) is formed. These cable neighborhood folded sections 52 are formed such that the height thereof (the height in the thickness direction of the circuit board 31) from the flat plate section 42 is lower than the height of the first folded section 44 and the second folded section 47. Furthermore, the height of the cable neighborhood folded sections 52 from the flat plate section 42 is set to such a height that the cable neighborhood folded sections 52 do not reach the back face 31b of the circuit board 31. Moreover, the cable neighborhood folded sections 52 are located at the position where the circuit board 31 is held between the cable 36 and the cable neighborhood folded sections 52.

In addition, the inside of the embedding hole 51 is filled with the resin constituting the case body 11. Furthermore, the respective cable neighborhood folded sections 52 are embedded inside the bottom section 21 of the case body 11 in the vicinity of the portion of the circuit board 31 to which the cable 36 is connected. Moreover, the resin constituting the case body 11 makes contact with the cable neighborhood contact faces 53 of the respective cable neighborhood folded sections 52.

As shown in FIGS. 1 and 2, the cover 12 is disposed on the tip end sides of the side wall sections 22 of the case body 11 so as to cover the circuit board 31. The cover 12 according to this embodiment is made of resin having light transmissivity. Like the circuit board 31, the cover 12 has a nearly toppled T-shape as viewed from the thickness direction of the circuit board 31.

As shown in FIG. 3, a condensing lens 61 is integrally formed on the side face of the cover 12 on the side of the case body 11. The condensing lens 61 is disposed on the opposite sides of the photoelectric element 33 and the plate member 41 with respect to the circuit board 31 (that is, disposed on the side of the front face 31a of the circuit board 31) and is opposed to the through hole 31c of the circuit board 31 inside the case 10 in the thickness direction of the circuit board 31. Furthermore, the photoelectric element 33 is positioned at the focus position of the condensing lens 61.

Figure 6:
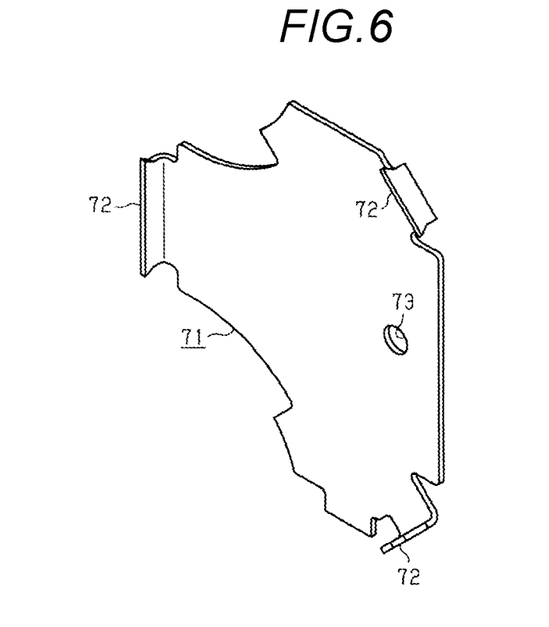
FIG. 6 is a perspective view showing a cover-side plate member according to the embodiment.

As shown in FIGS. 1 and 2, a cover-side plate member 71 formed by subjecting a metal plate to press processing is insert-molded in the cover 12. The cover-side plate member 71 is formed into a nearly toppled T-shape, one size smaller than that of the cover 12, as viewed from the thickness direction thereof. As shown in FIG. 6, cover side folded sections 72 formed by folding the peripheral section of the cover-side plate member 71 to the inner side of the case 10 are provided at a plurality of portions (three portions in this embodiment) of the peripheral section of the cover-side plate member 71. As shown in FIG. 3, the cover-side plate member 71 is embedded in the cover 12 in a state in which one end face thereof in the thickness direction thereof (the side face thereof on the opposite side of the side on which the cover side folded sections 72 are folded) is exposed to the outside. Furthermore, the respective cover side folded sections 72 (only one of them is shown in FIG. 3) are embedded in the cover 12, and the resin constituting the cover 12 makes contact with the whole surfaces of the respective cover side folded sections 72.

In addition, in the cover-side plate member 71, a circular slit 73 is formed at the position overlapping with the central section of the condensing lens 61. The slit 73 has a hole shape passing through the cover-side plate member 71, and its diameter is made smaller than that of the condensing lens 61. In the light receiver 1, the light having passed through the slit 73 passes through the condensing lens 61 and the through hole 31c and reaches the photoelectric conversion section 33a. At this time, the light having passed through the slit 73 is condensed by the condensing lens 61 toward the photoelectric conversion section 33a of the photoelectric element 33. On the other hand, the light projected to portions other than the slit 73 in the cover-side plate member 71 is reflected so as not to enter the inside of the case 10. The slit 73 adjusts the amount of the light to be projected to the photoelectric element 33 and adjusts the light receiving sensitivity in the light receiver 1.

Figure 8:
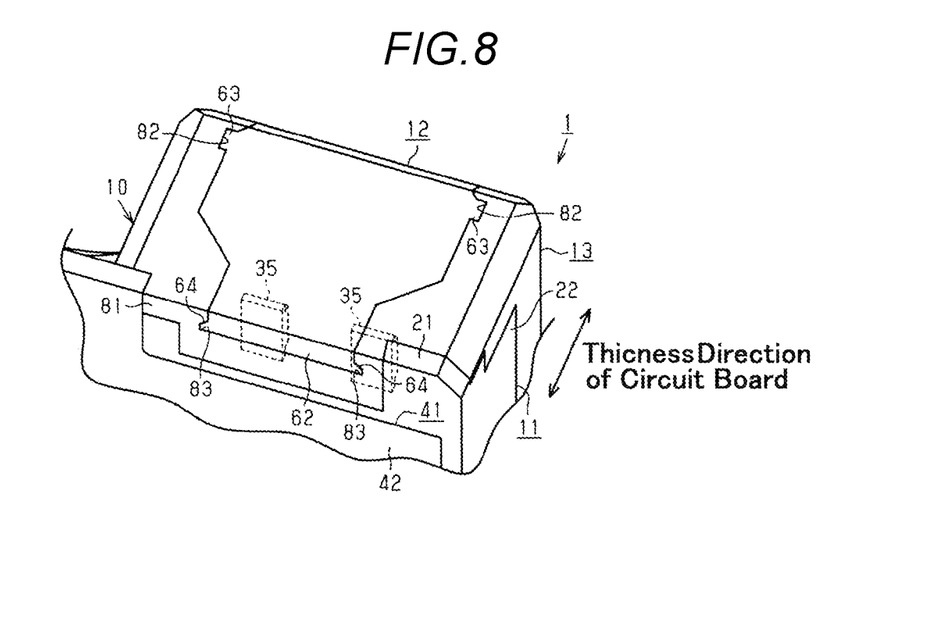
FIG. 8 is a partially enlarged perspective view showing the light receiver of the photoelectric sensor according to the embodiment.

As shown in FIGS. 2, 7(a) and 8, the cover 12 has an extension section 62 for covering the indication concave section 24 from the outside of the case body 11. The extension section 62 extends to the side of the bottom section 21 further than the face of the circuit board 31 (that is, the back face 31b) on the opposite side of the condensing lens 61 at the outer periphery the circuit board 31. In this embodiment, the extension section 62 reaches the outer face of the bottom section 21 of the case body 11. The light of the indication lamps 35 can be recognized from the extension section 62.

As shown in FIGS. 7(a) and 8, a pair of cover-side engaging sections 63 protruding to both the sides of the case 10 in the lateral direction thereof is provided at the base end section of the extension section 62. These cover-side engaging sections 63 are provided on the side of the condensing lens 61 rather than the circuit board 31. Furthermore, the respective cover-side engaging sections 63 protrude in a rectangular shape. Moreover, a pair of extension section-side engaging sections 64 protruding on both the sides of the case 10 in the lateral direction thereof is provided at the tip end section of the extension section 62. These extension section-side engaging sections 64 are provided on the side of the bottom section 21 rather than the circuit board 31. In this embodiment, the surface of each extension section-side engaging section 64 on the outer side of the case 10 is formed inside the same plane as the outer end face of the case body 11, that is, one of both the end faces of the bottom section 21 in the thickness direction thereof. Still further, each extension section-side engaging section 64 protrudes in a nearly trapezoidal shape.

As shown in FIGS. 1 and 2, the joint section 13 is formed between the case body 11 and the cover 12 by two-color molding, thereby integrating the case body 11 and the cover 12. More specifically, the joint section 13 is provided along the outer periphery of the cover 12, thereby enclosing the outer periphery of the cover 12. Furthermore, the joint section 13 joins the side wall sections 22 of the case body 11 and the end section of the bottom section 21 on the side of the cable 36 with the peripheral section of the cover 12. Still further, the joint section 13 is liquid-tightly made close contact with the case body 11 and the cover 12, thereby securing the water-tightness of the case 10.

As shown in FIGS. 7(a) and 8, on the inner peripheral face of an extension section enclosing section 81 enclosing the outer periphery of the extension section 62 in the joint section 13, a pair of first joint section-side engaging sections 82 engaging with the cover-side engaging sections 63 is provided on both the sides of the base end section of the extension section 62. The first joint section-side engaging section 82 is a rectangular concave section having an inner peripheral face corresponding to the outer shape of the cover-side engaging section 63. In addition, in the insides of the respective first joint section-side engaging sections 82, the cover-side engaging sections 63 corresponding thereto are respectively disposed, whereby the cover-side engaging sections 63 engage with the joint section 13 so as to be relatively unmovable in the thickness direction of the circuit board 31 (the same direction as the thickness direction of the bottom section 21 of the case body 11).

Furthermore, on the inner peripheral face of the extension section enclosing section 81, a pair of second joint section-side engaging sections 83 engaging with the extension section-side engaging sections 64 is provided on both the sides of the tip end section of the extension section 62. The second joint section-side engaging section 83 is a trapezoidal concave section having an inner peripheral face corresponding to the outer shape of the extension section-side engaging section 64. Moreover, in the insides of the respective second joint section-side engaging sections 83, the extension section-side engaging section 64 corresponding thereto are respectively disposed, whereby the extension section-side engaging sections 64 engage with the joint section 13 so as to be relatively unmovable in the direction parallel with the circuit board 31 (the same direction as the longitudinal direction of the case body 11 in this embodiment).

Furthermore, as shown in FIGS. 7(a) and 7(b), a cable enclosing section 84 enclosing the cable 36 in the joint section 13 has a nearly rectangular parallelepiped shape, and the cable 36 passes through this cable enclosing section 84 and is drawn out to the outside of the case 10. The cable enclosing section is liquid-tightly made close contact with the outer peripheral face of the cable 36.

The cable enclosing section 84 is provided with a coming-off preventing engaging section 85 with which the engaging step section 25 provided in the case body 11 engages in the drawing-out direction of the cable 36. The coming-off preventing engaging section 85 protrudes to the inside of the engaging step section 25 in the drawing-out direction of the cable 36. Furthermore, the coming-off preventing engaging section 85 is formed into a protruding streak extending in the lateral direction of the case body 11 (in the direction orthogonal to the face of the paper in FIG. 7(*a*)), and the shape of the cross section thereof orthogonal to the longitudinal direction of the case body 11 is formed into a rectangular shape. Moreover, the tip end face of the coming-off preventing engaging section 85 serves as a joint section-side engaging face 85*a* having a flat shape orthogonal to the drawing-out direction of the cable 36. The case body-side engaging face 25*a* of the engaging step section 25 is also formed into a flat shape orthogonal to the drawing-out direction of the cable 36. What's more, the case body-side engaging face 25*a* makes contact with the joint section-side engaging face 85*a* in the drawing-out direction of the cable 36. Still further, the coming-off preventing engaging section 85 is held between the circuit board 31 and the inner side face of the engaging step section 25 in the thickness direction of the circuit board 31.

Next, the working of this embodiment will be described.

As shown in FIG. 3, generally speaking, in the light receiver 1, the photoelectric element 33 is disposed at the focus position of the condensing lens 61; as a result, the distance between the condensing lens 61 and the photoelectric element 33 in the thickness direction of the circuit board 31 is determined by the focus position of the condensing lens 61. Hence, it is conceivable that the light receiver 1 is made more compact (thinner) by using a configuration in which the plate member 41 having been insert-molded in the bottom section 21 of the case body 11 disposed on the opposite side of the condensing lens 61 with respect to the circuit board 31 is brought close to the circuit board 31.

In the light receiver 1 according to this embodiment, since the first cutout hole 45 having passed through the plate member 41 in the thickness direction thereof is provided at the portion of the plate member 41 opposed to the photoelectric element 33, even if the plate member 41 is brought close to the circuit board 31 in the thickness direction of the circuit board 31, a distance can be secured between the photoelectric element 33 and the plate member 41. Hence, the plate member 41 can be brought close to the circuit board 31 in the thickness direction of the circuit board 31 while the insulation between the plate member 41 and the photoelectric element 33 is secured.

Furthermore, the photoelectric element 33 is mounted on the back face 31*b* of the circuit board 31, thereby protruding further than the circuit board 31 toward the plate member 41. Moreover, since the case body 11 is made of resin, the respective portions of the case body 11 are required to have thicknesses not smaller than a certain value in order to secure the strength of the case body 11. Hence, with the configuration in which the portion of the plate member 41 opposed to the photoelectric element 33 is provided with the first cutout hole 45 passing through the plate member 41 in the thickness direction thereof as in this embodiment, the photoelectric element accommodating concave section 26 recessed in the direction away from the back face 31*b* of the circuit board 31 can be formed while the thickness of the resin is secured at the portion of the bottom section 21 overlapping with the first cutout hole 45. Still further, the circuit board 31 is disposed on the bottom section 21 of the case body 11 while the photoelectric element 33 is accommodated in the photoelectric element accommodating concave section 26, whereby the bottom section 21 can be made contact with the back face 31*b* of the circuit board 31. Hence, even in the configuration in which the photoelectric element 33 is mounted on the back face 31*b* of the circuit board 31, the plate member 41 can be brought close to the circuit board 31 in the thickness direction of the circuit board 31.

Next, the characteristic advantages of this embodiment will be described.

(1) The plate member 41 is provided with the first cutout hole 45 passing through the plate member 41 at the portion overlapping with the photoelectric element 33 in the thickness direction of the circuit board 31. Hence, the plate member 41 can be brought close to the circuit board 31 in the thickness direction of the circuit board 31 while the insulation between the plate member 41 and the photoelectric element 33 is secured. Consequently, the light receiver 1 can be made more compact in the thickness direction of the circuit board 31.

(2) The first folded section 44 and the second folded section 47 to be embedded in the resin constituting the case body 11 are provided on the plate member 41, and the resin constituting the case body 11 makes contact with the first contact face 46 provided on the first folded section 44 and the second contact face 49 provided on the second folded section 47. Hence, the plate member 41 is hardly separated from the case body 11 in the thickness direction of the plate member 41. Consequently, the integration strength between the case body 11 and the plate member 41 insert-molded in the case body 11 can be increased.

(3) The first folded section 44 and the second folded section 47 are formed by folding the peripheral sections of the plate member 41 so as to have an angle of 90° with respect to the flat plate section 42 on the inner side of the case 10. Hence, the space inside the case 10 in which the circuit board 31 is disposed is suppressed from being narrowed by the first folded section 44 and the second folded section 47. Consequently, the integration strength between the case body and the plate member 41 can be increased while the enlargement of the case 10 due to the first folded section 44 and the second folded section 47 provided on the plate member 41 is suppressed. In addition, the first folded section 44 and the second folded section 47 can be formed easily by press processing.

(4) The first folded section 44 has an angle of 90° with respect to the flat plate section 42 on the inner side of the case 10, and the first cutout hole 45 passing through the first folded section 44 is formed in the first folded section 44. Furthermore, the first contact face 46 is provided on the inner peripheral face of the first cutout hole 45. Moreover, the second folded section 47 has an angle of 90° with respect to the flat plate section 42 on the inner side of the case 10 and has the second cutout hole 48 passing through the second folded section 47. Still further, the second contact face 49 is provided on the inner peripheral face of the second cutout hole 48. Hence, while the space inside the case 10 in which the circuit board 31 is disposed is suppressed from being narrowed by the first folded section 44 and the second folded section 47, the plate member 41 having the first folded section 44 and the second folded section 47 can be made most compact in the lateral direction of the plate member 41. Hence, the case can be made more compact in the direction parallel with the plate member 41; as a result, the light receiver 1 can be made further more compact. In addition, the first contact face 46 is provided on the inner peripheral face of the first cutout hole 45 formed in the first folded section 44, and the second contact face 49 is provided on the inner peripheral face of the second cutout hole 48 formed on the second folded section 47. Hence, the first folded section 44 and the second folded section 47 are not required to be subjected to any complicated processing to provide the first contact face 46 and the second contact face 49. Still further, the enlargement of the first folded section 44 having the first contact face 46 and the second folded section 47 having the second contact face 49 can be suppressed.

(5) The cable neighborhood folded sections 52 having the cable neighborhood contact faces 53 are formed on the plate member 41 at the portion overlapping with the cable 36 in the thickness direction of the circuit board 31. Hence, the integration strength between the case body 11 of the case 10 and the plate member 41 can be increased at the portion to which a large force may be applied via the cable 36, for example, when the cable 36 is pulled.

(6) The coming-off preventing engaging section 85 of the joint section 13 engages with the engaging step section 25 of the case body 11 in the drawing-out direction of the cable 36. Since the case body 11 accommodates the circuit board 31 to which the cable 36 is connected, the case body 11 is pulled in the drawing-out direction of the cable 36 when the cable 36 is pulled. Hence, the coming-off preventing engaging section 85 engaging with the engaging step section 25 of the case body 11 in the drawing-out direction of the cable 36 is provided in the joint section 13, whereby the case 10 can be suppressed from being displaced in the drawing-out direction of the cable 36 with respect to the cover 12 when the cable 36 is pulled.

(7) The cover-side engaging sections 63 provided on the cover 12 engage with the joint section 13 on the side of the condensing lens 61 rather than the circuit board 31 so as to be relatively unmovable in the thickness direction of the circuit board 31. Hence, the cover 12 can be suppressed from coming off from the joint section 13 in the thickness direction of the circuit board 31.

(8) The extension section-side engaging sections 64 provided on the extension section 62 of the cover 12 engage with the joint section 13 so as to be relatively unmovable in the direction parallel with the circuit board 31 on the side of the bottom section 21 of the case body 11 rather than the circuit board 31. Hence, the extension section 62 can be suppressed from coming off from the joint section 13, and the cover 12 can eventually be suppressed from coming off from the joint section 13.

(9) In the light receiver 1 according to this embodiment being made compact in the thickness direction of the circuit board 31, since the plate member 41 is insert-molded in the case body 11, the strength of the case body 11 made compact in the thickness direction of the circuit board 31 can be secured.

(10) The circuit board 31 and the plate member 41 can easily be brought close to each other in the thickness direction of the circuit board 31 by accommodating the photoelectric element 33 in the photoelectric element accommodating concave section 26. Hence, the light receiver 1 can easily be made compact in the thickness direction of the circuit board 31.

(11) The shielding pattern 34 is provided inside the circuit board 31. Hence, the circuit board 31 may merely have a size enough to allow the electronic components 32 to be disposed on the front face 31a thereof. Hence, the circuit board 31 can be made compact in comparison with the case in which the shielding pattern 34 is provided on the front face 31a of the circuit board 31 on the side of the condensing lens 61. As a result, the light receiver 1 can be made more compact.

(12) The first cutout hole 45 serves as both a cutout section provided at the portion of the plate member 41 overlapping with the photoelectric element 33 in the thickness direction of the circuit board 31 and a cutout hole passing through the first folded section 44. Hence, the plate member 41 can be formed easily in comparison with the case in which the cutout section passing through the first folded section 44 and the cutout hole are formed separately. Furthermore, the enlargement of the plate member 41 can be suppressed.

(13) The plate member 41 has the fixing sections 43 for fixing the light receiver 1 to the outside. Hence, the case body 11 can be made compact in the thickness direction of the circuit board 31 while the strength of the case body 11 is secured in comparison with, for example, the case in which cylindrical metal bushings into which screws for fixing the light receiver 1 to the outside are inserted are embedded in the case body 11.

(14) For example, in the case that a slit is printed on the surface of the cover 12 by silk screen printing, if the surface of the cover 12 is scratched or if a chemical attaches to the surface of the cover 12, the slit is in danger of being peeled. If the slit is peeled, there is a danger that the optical characteristics of the light receiver 1 may be lost. Furthermore, in the case that a slit is printed on the surface of the cover 12 by silk screen printing, the minimum diameter of the slit varies depending on a screen plate, whereby it is sometimes difficult to form a slit having a desired diameter. Furthermore, a metal component having a slit is sometimes formed separately from the light receiver and the component is attached to the light receiver. In this case, however, there is a problem that it is difficult to dispose the component at the mounting position on the light receiver accurately or a problem that the number of components increases. On the other hand, in this embodiment, the slit 73 is formed in the cover-side plate member 71 made of metal, and the cover-side plate member 71 is insert-molded in the cover 12. Hence, the slit 73 can be provided while the number of components is suppressed, and the slit 73 can be suppressed from being removed by scratching or by the attachment of a chemical. Moreover, since the strength of the cover 12 is increased by the cover-side plate member 71, the cover 12 can be made thinner in the thickness direction thereof.

(15) The cover-side plate member 71 has the cover-side folded sections 72 that are formed by folding the peripheral section of the cover 12 to the inner side of the case 10 and embedded in the cover 12. Hence, the cover-side plate member 71 is hardly separated from the cover 12. Consequently, the integration strength between the cover 12 and the cover-side plate member 71 can be increased.

(16) The first folded section 44 and the second folded section 47 are formed at the peripheral section of the plate member 41. Hence, the first folded section 44 and the second folded section 47 can easily be embedded inside the side wall sections 22, whereby the strength of the case body 11 can easily be enhanced.

The above-mentioned embodiment may be changed as described below.

In the above-mentioned embodiment, the shielding pattern 34 serving as an electromagnetic shield for the photoelectric element 33 is provided inside the circuit board 31. However, the electromagnetic shield for the photoelectric element 33 is not limited to this shielding pattern. For example, the cover-side plate member 71 may be used as an electromagnetic shield by connecting the cover-side plate member 71 to the ground via the circuit board 31. In this case, the shielding pattern 34 provided inside the cover-side plate member 71 can be omitted.

In the above-mentioned embodiment, the extension section-side engaging sections 64 engage with the joint section 13 so as to be relatively unmovable in the direction parallel with the circuit board 31. However, in the case that the extension section-side engaging sections 64 are formed on the end face of the case body 11 on the side of the circuit board 31 rather than the outer end face of the case body 11, that is, one of both the end faces of the bottom section 21 of the case body 11 in the thickness direction thereof, it would be preferable that the extension section-side engaging sections 64 is formed so as to engage with the joint section 13 and to be relatively unmovable in the thickness direction of the circuit board 31. With this configuration, the advantage similar to that described in the item (8) according to the above-mentioned embodiment can also be obtained.

In the above-mentioned embodiment, the extension section-side engaging sections 64 are formed so as to protrude from the tip end section of the extension section 62 to both the sides of the case 10 in the lateral direction thereof. Furthermore, the second joint section-side engaging section 83 with which the extension section-side engaging section 64 engages is a recessed section having an inner peripheral face corresponding to the outer shape of the extension section-side engaging section 64. However, the extension section-side engaging section 64 may have a concave shape recessed in the lateral direction of the case 10 at the tip end section of the extension section 62, and the second joint section-side engaging section 83 may have a convex shape having an outer peripheral face corresponding to the inner peripheral face of the extension section-side engaging section 64 having the concave shape. Moreover, the cover 12 is not necessarily equipped with the extension section-side engaging sections 64.

In the above-mentioned embodiment, the cover-side engaging sections 63 are formed so as to protrude from the base end section of the extension section 62 to both the sides of the case 10 in the lateral direction thereof. Furthermore, the first joint section-side engaging section 82 with which the cover-side engaging section 63 engages is a concave section having an inner peripheral face corresponding to the outer shape of the cover-side engaging section 63. However, the cover-side engaging section 63 may be formed into a concave shape being recessed in the lateral direction of the case 10 at the base end section of the extension section 62, and the first joint section-side engaging section 82 may be formed into a convex shape having the outer peripheral face corresponding to the inner peripheral face of the cover-side engaging section 63 having the concave shape. Moreover, the cover 12 is not necessarily equipped with the cover-side engaging sections 63.

The shapes of the engaging step section 25 and the coming-off preventing engaging section 85 engaging with each other in the drawing-out direction of the cable 36 are not limited to the shapes according to the above-mentioned embodiment. For example, instead of the engaging step section 25, an engaging concave section (second engaging section) being recessed in the direction parallel with the drawing-out direction of the cable and being open to the outer side of the case body 11 may be provided in the bottom section 21 of the case body 11. Furthermore, the case body 11 is not necessarily equipped with the engaging step section 25. Moreover, the joint section 13 is not necessarily equipped with the coming-off preventing engaging section 85.

The shape of the cable neighborhood folded sections 52 is not limited to the shape according to the above-mentioned embodiment. The cable neighborhood folded sections 52 may have a shape obtained by folding the plate member 41 to the inner side of the case 10 at the portion of the plate member 41 overlapping with the cable 36 in the thickness direction of the circuit board 31. Furthermore, the cable neighborhood folded sections 52 may have cable neighborhood contact faces directed to the base end sections of the cable neighborhood folded sections 52 and making contact with the resin constituting the case body 11.

Figure 9:
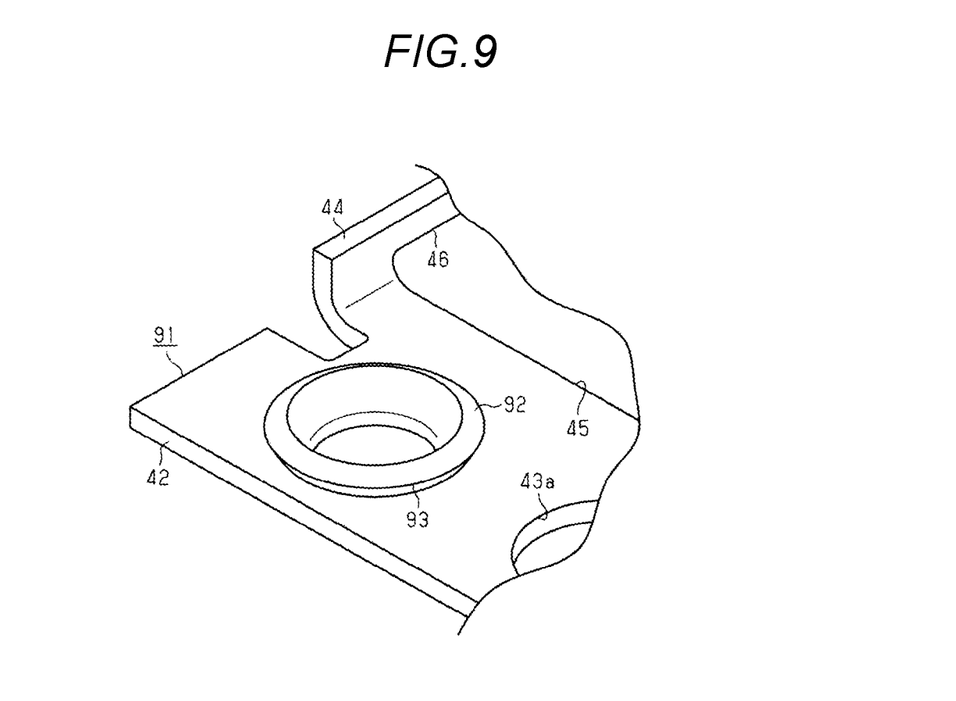
FIG. 9 is a partially enlarged perspective view showing a plate member according to another embodiment.

For example, the cable neighborhood folded section 92 provided on the plate member 91 shown in FIG. 9 is formed in a nearly cylindrical shape. Furthermore, the plate member 91 is equipped with a cable neighborhood folded section 92 instead of the cable neighborhood folded sections 52 formed on the plate member 41 according to the above-mentioned embodiment. This cable neighborhood folded section 92 is formed by subjecting the portion of the plate member 91 overlapping with the cable 36 in the thickness direction of the circuit board 31 to burring processing so that the portion of the plate member 91 is folded to the inner side of the case 10 so as to be formed into a cylindrical shape and then by further subjecting the portion folded into the cylindrical shape to press processing so as to increase the inside diameter of the tip end section of the folded portion. Furthermore, the outer peripheral face at the tip end section of the cable neighborhood folded section 92 serves as a cable neighborhood contact face 93 directed to the base end section side of the cable neighborhood folded section 92. The cable neighborhood folded section 92 is embedded into the case body 11 when the plate member 91 is insert-molded in the case body 11. Moreover, the resin constituting the case body 11 makes contact with the cable neighborhood contact face 93. With this configuration, the advantage similar to that described in the item (5) according to the above-mentioned embodiment can also be obtained.

However, the plate member 41 is not necessarily equipped with the cable neighborhood folded sections 52.

In the above-mentioned embodiment, the first folded section 44 and the second folded section 47 have an angle of 90° with respect to the flat plate section 42 on the inner side of the case 10. However, the first folded section 44 and the second folded section 47 may have an angle other than 90° with respect to the flat plate section 42 on the inner side the case 10. For example, the first folded section 44 and the second folded section 47 may be formed by folding the peripheral section of the plate member 41 so as to have an angle larger than 90° with respect to the flat plate section 42 on the inner side of the case 10. With this configuration, the advantage similar to that described in the item (3) according to the above-mentioned embodiment can be obtained.

In the above-mentioned embodiment, the first cutout hole 45 serves as both the cutout section provided at the portion of the plate member 41 overlapping with the photoelectric element 33 in the thickness direction of the circuit board 31 so as to pass through the plate member 41 and the cutout hole passing through the first folded section 44. However, the cutout hole passing through the first folded section 44 and the cutout section may be separately formed to the plate member 41. Furthermore, the second cutout hole 48 may be formed so as to be connected to the first cutout hole 45.

In the above-mentioned embodiment, the first contact face 46 is provided on the inner peripheral face of the first cutout hole 45 passing through the first folded section 44. However, for example, the first contact face 46 directed to the base end side of the first folded section 44 may be provided on the outer peripheral face of the first folded section 44 by bending the first folded section 44 a plurality of times. The state in which the first contact face 46 is directed to the base end side is the state in which the first contact face 46 is parallel with the plate member 41 and is opposed to an imaginary plane passing through the base end section of the first folded section 44, that is, the state in which the imaginary plane overlaps with the first contact face 46 in the thickness direction of the circuit board 31. This is similarly applied to the second contact face 49 provided on the second folded section 47.

In the above-mentioned embodiment, the first folded section 44 and the second folded section 47 are provided at the peripheral section of the plate member 41. However, the first folded section 44 and the second folded section 47 are not necessarily provided at the peripheral section of the plate member 41, but may be provided inside the peripheral section of the plate member 41. Moreover, the plate member 41 is not necessarily equipped with the first folded section 44 and the second folded section 47.

In the above-mentioned embodiment, the condensing lens 61 is formed so as to be integrated with the cover 12. However, the condensing lens 61 may be formed separately from the cover 12 and fixed to the cover 12, thereby being provided on the cover 12.

In the above-mentioned embodiment, the light receiver of a transmission-type photoelectric sensor has been described. However, the above-mentioned embodiment and the above-mentioned modifications may also be applied to a reflection-type photoelectric sensor equipped with a light projecting element for projecting light and the photoelectric element 33.

Next, technical ideas that can be grasped according to the above-mentioned embodiment and modifications will be additionally described below.

(A) The photoelectric sensor according to any one of claims 1 to 8, wherein a photoelectric element accommodating concave section accommodating the photoelectric element is formed at the portion on the inner face of the case overlapping with the cutout section in the thickness direction of the circuit board.

With this configuration, the photoelectric element is accommodated in the photoelectric element accommodating concave section, whereby the circuit board and the plate member can be brought close to each other in the thickness direction of the circuit board. Hence, the photoelectric sensor can easily be made compact in the thickness direction of the circuit board.

(B) The photoelectric sensor according to any one of claims 1 to 8, wherein a shielding pattern connected to the ground is provided around the through hole inside the circuit board.

With this configuration, the circuit board can be made compact in comparison with the case in which the shielding pattern serving as an electromagnetic shield for the photoelectric element is provided on the face of the circuit board on the side of the condensing lens. Consequently, the photoelectric sensor can be made further more compact.

Although the present invention has been described in detail with reference to specific embodiments, it is obvious to those skilled in the art that various changes and modifications can be made without departing from the spirit and scope of the present invention.

The present application is based on Japanese Patent Application (patent application 2015-072572) filed on Mar. 31, 2015, and the contents thereof are herein incorporated by reference.

DESCRIPTION OF REFERENCE NUMERALS AND SIGNS

10 . . . case, 11 . . . case body, 12 . . . cover, 13 . . . joint section, 21 . . . bottom section, 22 . . . side wall section, 25 . . . engaging step section serving as second engaging section, 31 . . . circuit board, 31b . . . back face serving as face of circuit board on opposite side of condensing lens, 31c . . . through hole, 33 . . . photoelectric element, 35 . . . indication lamp, 36 . . . cable, 41, 91 . . . plate member, 42 . . . flat plate section, 44 . . . first folded section serving as folded section, 45 . . . first cutout hole serving as cutout section and cutout hole, 46 . . . first contact face serving as contact face, 47 . . . second folded section serving as folded section, 48 . . . second cutout hole serving as cutout hole, 49 . . . second contact face serving as contact face, 52, 92 . . . cable neighborhood folded section, 53, 93 . . . cable neighborhood contact face, 61 . . . condensing lens, 62 . . . extension section, 63 . . . cover-side engaging section, 64 . . . extension section-side engaging section, 85 . . . coming-off preventing engaging section serving as first engaging section

The invention claimed is:

1. A photoelectric sensor comprising:
a case made of resin and provided with a condensing lens through which light is transmitted;
a circuit board on which a photoelectric element disposed at a focus position of the condensing lens is mounted and which is accommodated in the case; and
a plate member made of metal and insert-molded in the case so as to be parallel with the circuit board,
wherein the circuit board has a through hole through which the light transmitted through the condensing lens passes,
wherein the photoelectric element is mounted on a face of the circuit board on an opposite side of the condensing lens, and the photoelectric element receives the light passed through the through hole; and
wherein the plate member is disposed on an opposite side of the condensing lens with respect to the circuit board, and the plate member has a cutout section passing through the plate member at a position overlapping with the photoelectric element in a thickness direction of the circuit board.

2. The photoelectric sensor according to claim 1, wherein the plate member includes a folded section folded to an inside of the case and embedded in the resin constituting the case, and
wherein the folded section includes a contact face which directs to a base end side of the folded section and which is in contact with the resin constituting the case.

3. The photoelectric sensor according to claim 2, wherein the plate member includes a flat plate section having a flat plate shape and provided so as to be parallel with the circuit board, and
wherein the folded section is formed by folding a peripheral section of the plate member so as to have an angle of 90° or more with respect to the flat plate section on the inner side of the case.

4. The photoelectric sensor according to claim 3, wherein the folded section is formed so as to have an angle of 90° with respect to the flat plate section on the inner side of the case, and the folded section has a cutout hole passing through the folded section, and wherein the contact face is provided on an inner peripheral face of the cutout hole.

5. The photoelectric sensor according to claim 1, wherein a cable drawn out from the case to an outside is connected to the circuit board, wherein the plate member includes a cable neighborhood folded section folded to the inner side of the case at a portion overlapping with the cable in the thickness direction of the circuit board, and wherein the cable neighborhood folded section includes a cable neighborhood contact face which directs to a base end side of the cable neighborhood folded section and which is in contact with the resin constituting the case.

6. The photoelectric sensor according to claim 1, wherein the case includes:
- a case body made of resin in which the circuit board is accommodated and the plate member is insert-molded;
- a cover made of resin which is disposed so as to cover the case body and in which the condensing lens is provided; and
- a joint section made of resin which is formed by two-color molding between the case body and the cover so as to integrate the case body and the cover, wherein a cable drawn out from the joint section to an outside of the case is connected to the circuit board, wherein the joint section includes a first engaging section that receives a force applied from the case body in a drawing-out direction of the cable; and wherein the case body includes a second engaging section engaging with the first engaging section in the drawing-out direction of the cable.

7. The photoelectric sensor according to claim 6, wherein the cover includes a cover-side engaging section engaging with the joint section so as to be relatively unmovable in the thickness direction of the circuit board on a side of the condensing lens further than the circuit board.

8. The photoelectric sensor according to claim 6, wherein the case body includes a bottom section on which the circuit board is disposed, and the case body includes a side wall section standing upright on a peripheral section of the bottom section, wherein an indication lamp from which light is emitted is disposed on the circuit board, and wherein the cover has light transmissivity so as to allow the light of the indication lamp to be transmitted, and the cover includes an extension section extending to a side of the bottom section further than a face of the circuit board on the opposite side of the condensing lens at an outer periphery of the circuit board and an extension section-side engaging section engaging with the joint section on the side of the bottom section further than the circuit board so as to be relatively unmovable in the thickness direction of the circuit board or in the direction parallel with the circuit board.

* * * * *